(12) United States Patent
Eloranta

(10) Patent No.: US 7,026,967 B2
(45) Date of Patent: Apr. 11, 2006

(54) METHOD FOR CALIBRATING A DIGITAL-TO-ANALOG CONVERTER AND A DIGITAL-TO-ANALOG CONVERTER

(75) Inventor: Petri Eloranta, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/970,393

(22) Filed: Oct. 22, 2004

(65) Prior Publication Data
US 2005/0052297 A1  Mar. 10, 2005

Related U.S. Application Data

(63) Continuation of application No. PCT/FI02/00454, filed on May 27, 2002.

(51) Int. Cl.
*H03M 1/10* (2006.01)
(52) U.S. Cl. .................................... 341/120; 341/144
(58) Field of Classification Search ................ 341/155, 341/144, 172, 156, 120, 133, 166, 118, 150; 375/232
See application file for complete search history.

(56) References Cited

U.S. PATENT DOCUMENTS

| | | | | |
|---|---|---|---|---|
| 5,949,362 | A * | 9/1999 | Tesch et al. ................ | 341/144 |
| 5,955,980 | A | 9/1999 | Hanna | |
| 6,452,527 | B1 * | 9/2002 | Takeya et al. ............... | 341/144 |
| 6,507,304 | B1 * | 1/2003 | Lorenz ........................ | 341/144 |
| 6,720,898 | B1 * | 4/2004 | Ostrem ........................ | 341/144 |
| 6,738,000 | B1 * | 5/2004 | Boxho ......................... | 341/120 |
| 6,836,236 | B1 * | 12/2004 | Horie .......................... | 341/155 |

FOREIGN PATENT DOCUMENTS

| EP | 0 898 374 A2 | 2/1999 |
|---|---|---|
| EP | 0 929 158 A2 | 7/1999 |

* cited by examiner

*Primary Examiner*—Brian Young
(74) *Attorney, Agent, or Firm*—Squire, Sanders & Dempsey LLP

(57) ABSTRACT

The invention describes a method for digitally calibrating a segmented current-steering D/A-converter. One embodiment of the present invention is a 14-bit DAC, where 6 MSB's are converted with two unweighted current source array. Further, in this invention a new method for organising the switching order based on the analysed data of mismatch of the current sources is presented. A programmable mapping device is used instead of the fixed thermometer decoding before the switch array. Using this programmable mapping device the switching order of the current switches can be selected optimally so that the error in the resulting analog signal is minimised. The switching order is programmed to the mapping device on the basis of the calibration method according to the present invention. The inventive amendment is aimed at processing errors which cause poor matching inside the component itself. This amendment is done by rearranging unweighted unity current switches into a more optimum order.

11 Claims, 14 Drawing Sheets

Before calibration

| 3 | 34 | 56 | 21 | 18 ———————————— 33 | 14 | 61 | 10 | 9 |

Phase 1

| 63 | 62 | 61 | 60 | 59 ———————————— 5 | 4 | 3 | 2 | 1 |

Phase 2

| 63 | 1 | 61 | 3 | 59 ———————————— 58 | 4 | 60 | 2 | 62 |

Fig. 7b

METHOD FOR CALIBRATING A DIGITAL-TO-ANALOG CONVERTER AND A DIGITAL-TO-ANALOG CONVERTER

This is a Continuation of International Application No. PCT/FI02/00454 filed May 27, 2002, which designated the U.S. and was published under PCT Article 21(2) in English.

FIELD OF THE INVENTION

The present invention relates to integrated electronic circuits. In particular, the present invention relates to a novel and improved method for calibrating an unweighted current source array of a segmented current-steering D/A-converter and to a novel and improved D/A-converter design implementing said calibration method.

BACKGROUND OF THE INVENTION

Digital-to-analog converters are widely used for converting digital signals to corresponding analog signals for many electronic circuits. For example, a high resolution, high speed digital-to-analog converter (DAC) may find applications in cellular base stations, wireless communications, direct digital frequency synthesis, signal reconstruction, test equipment, high resolution imaging systems and arbitrary waveform generators, for example.

The requirements of the telecommunication applications demand 10–16-bit D/A-converters that can operate at sampling frequencies of hundreds of megahertz. For the high-speed operation, the current-steering topology is the mostly used choice. Though there are methods to design a current-steering DAC to fulfil a 14-bit DC-linearity with some yield, the high frequency behaviour becomes unacceptable. In commercial DAC's, where the dynamic behaviour has a higher priority, the high yield DC-linearity is in the order of 10–12-bit.

The high-resolution (>10 bit) current-steering D/A-converters are typically divided into two or more different subsets, so that each of the subsets makes a conversion of some of the input bits from digital signal into an analog current. An example of such a topology is shown in FIG. 1. The MSB-subset is the most critical because it converts the most significant bits, and therefore most of the output signal.

In a segmented current steering DAC the MSB-block or subset is a matrix of unweighted current sources that are controlled by thermometer decoded input bits. This means that for example 6 MSB's are thermometer decoded into 63 control signals which control the 63 differential current switches. Because one of the 64 signal levels that 6-bit binary word ($2^6$) can point is 0, only 63 signals are needed. The LSB-block has typically binary-weighted current sources that are controlled by the LSB's without any decoding. In addition to that, there can be a middle bit conversion that can be both binary-weighted or unweighted.

The use of some calibration method is a good way of designing a high-resolution DAC for high AC-linearity performance. In the calibration case the design can focus on getting a good high frequency behaviour and leaving the calibration to handle the DC-linearity requirements.

The DC-linearity of the current steering DAC is mainly affected by the matching of the current source transistors in the MSB subset. The random mismatch of a current source can be calculated using the following equation (1):

$$\left(\frac{\sigma_{Id}}{Id}\right)^2 = \sigma_k^2 + \frac{4*\sigma_{\Delta Vth}^2}{(V_{gs}-V_{t0})^2}.., \quad \text{where} \tag{1}$$

$$\sigma_k = \frac{A}{\sqrt{W*L}} \quad \text{and} \quad \sigma_{\Delta Vth} = \frac{A_{vth}}{\sqrt{W*L}}.$$

A and $A_{vth}$ are the process dependent variables. W and L are the width and the length of the current source transistor, respectively, and $V_{gs}$ is the gate-source voltage of the transistor.

As an example a relative current distribution in percentages of current sources with σ=0.225% mismatch is shown in FIG. 2.

In addition to the random mismatch there is also some systematic errors that are mainly caused by process related gradients and voltage drops in the supply lines. The cumulation of the systematic errors can be compensated with careful layout design. Also some switching order randomising is used.

The switching order of the current source array is typically selected so that the cumulating of the systematic errors are evenly spread over the full ramp signal. One of the most common methods is symmetrical switching. However, the switching order randomising affects only the systematic error cumulating. Also the shape of the cumulating error affects the dynamic performance. Especially if the INL curve is heavily bowed, the DC-non-linearity can increase the distortion. On the other hand, the large INL error increases the quantization noise.

In FIGS. 3a and 3b are DNL and INL curves of the unweighted array referred to 14-bit resolution. The 63 current sources are ideal added with a random error of $\sigma_{Id}$=0.225%. Each of the current sources is described with the following equation. The result is from 1000 Matlab simulations.

$$I_{MSBi} = I_{MSBi0} * \left(1 + X_{rand} * \frac{\sigma_{Id}}{I_d}\right), \tag{2}$$

where $X_{rand}$ is a normally distributed random number. $I_{MSB0}$ is the ideal current and $\sigma_{Id}/I_d$ is the standard deviation of the error. FIG. 4 and FIG. 5 show the relative distribution of the DNL and INL errors. As shown in FIG. 5, a typical INL is nearly 12-bit and only 11-bits is achievable with high yield.

The mismatch of the current sources determines the DC-linearity behaviour of the whole D/A-converter. The target is to have both the DNL and the INL values less than 0.5 LSB. The differential non-linearity (DNL) describes how large the step deviation from 1 LSB is. The integral non-linearity (INL) shows the cumulating sum of the errors. Therefore for the sufficient DC-linearity, the mismatch should be small enough so as not to deviate the currents too much from the nominal. Due to the Gaussian distribution nature of the random mismatch, the design margins must be relatively large to guarantee a high yield.

However, if the DAC is designed to fill the DC-linearity specification, the high frequency behaviour is typically bad, because this leads to non-optimal design for high frequency signals.

In prior-art solutions, a non-calibrated high-resolution DAC has typically low or intermediate high frequency behaviour, due to the optimisation for full DC-linearity. Therefore for high-resolution and high-frequency performance, some calibration is highly desired.

A pseudo calibration method called dynamic element matching is a common method, especially in D/A-converters inside sigma-delta type of data converters. The method spreads the linearity errors to the noise floor by continuously changing the order of the switching pattern.

The actual calibration methods have two main bases, trimming the actual current sources, or having an extra low precision DAC to generate a correction term to the output. These methods need typically a continuous calibration due to the changing conditions. For example temperature or biasing conditions can vary.

The drawbacks of these prior-art solutions are as follows. The layout techniques that focus on distribution of the systematic errors cannot affect the errors that are generated by the random mismatch of the transistors. The use of parallel arrays can average these random errors, but the circuit complexity still decreases the high frequency performance. Also, since the random mismatch is a function of the transistor area and overdrive voltage, designing a high resolution DAC consumes both area and power. The most important issue, however, is that the designing for full DC-linearity decreases the high-frequency behaviour. Therefore, these DAC's are typically not suitable for high-speed operation.

The dynamic element matching method spreads the DC-linearity errors into the noise floor, and therefore the errors still exists even though the distortion is low. The SNDR (Signal-to-noise-and-distortion) value is still the same in the frequency band of $f_{sample}/2$ with or without the dynamic matching method, and therefore the actual effective number of bits does not increase at all.

The use of current source that can be trimmed increases the complexity of the analog parts in the DAC, and therefore the DAC is not easy to be optimised for high frequency performance. The prior art calibration methods are sensitive to the changes in the biasing or ambient temperature.

If the additional DAC or current sources are used in the calibration, the complexity of the analog part is further increased. These methods also lead to problems in high-frequency operation, since the penalty is an imbalance in the main DAC.

U.S. Pat. No. 6,118,398 describes a digital-to-analog converter (DAC) which includes a plurality of current sources on a substrate operable in a predetermined sequence of use for generating an output current based upon a digital input, and a connection network for establishing the predetermined sequence of use for the current sources based upon the actual current values and for increasing the performance of the DAC. Said connection network can be used to reduce integral non-linearity error of the DAC. The connection network may be provided by a plurality of fusible links selectively connected to set the predetermined sequence of use. The connection network is, however, connected after the digital part of the whole converter and is thus located on the analog side. This makes the design of the analog more complex and remarkably affects the high frequency linearity of the analog side. The plurality of the current sources has actual values that can be sorted from lowest to highest, and each actual current value will define an error value with both a magnitude and polarity relative to the desired value. One embodiment for sorting the order of use of the current sources is based upon the error values.

The purpose or target of the present invention is to decrease the high variation in the INL curves, so that the cumulating of the errors does not generate highly bowed linearity curves. On the other hand, moving the maximum deviations near the zero- and full-scale codes, the limiting of the signal swing can always decrease the effect of the DC errors from the signal. When the cumulating of the errors is reduced, the calibrated INL is always less than without the calibration.

Further, the object of the present invention is to provide a digital-to-analog converter design in which the improvement of the DC-linearity is achieved with less effects on the AC-linearity.

SUMMARY OF THE INVENTION

The invention describes a method for digitally calibrating a segmented current-steering D/A-converter. One embodiment of the present invention is a 14-bit DAC, where 6 MSB's are converted with two unweighted switchable current source array. Further, in this invention a new method for organising the switching order based on the analysed data of mismatch of the current sources is presented. A programmable mapping device is used instead of the fixed thermometer decoding before the switch array. Using this programmable mapping device the switching order of the current switches can be selected optimally so that the error in resulting analog signal is minimised. The switching order is programmed to the mapping device on the basis of the calibration method according to the present invention.

The inventive amendment is aimed at processing errors which cause poor matching inside the component itself. This amendment is done by rearranging the unweighted unity current switches into a more optimum order.

Thanks to the calibration method of the present invention the new design of the DAC does not have any effect on the analog parts of the current DAC's. Therefore there is no risk of decreasing the dynamic performance of the DAC by implementing the calibration. Further, the calibration method according to the present invention does not increase the complexity of the analog part of the DAC since everything is done in the digital part of the DAC. In fact the use of the digital calibration method makes it possible to design the DAC to be fully optimised for the high frequency performance. Also the analog area of the DAC can be kept small, which is also an advantage for the high-frequency behaviour.

If the DAC is a part of some larger system that has processing power, the whole calibration algorithm can be implemented with suitable software. If the DAC is a stand-alone chip, the calibration algorithm can be implemented on the same chip, and the DAC can operate as a self calibrating DAC. After the calibration, the calibration logic can be put to a power-down state, and it consumes no current.

The method according to the present invention calibrates both the random and the systematic errors.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings:

FIG. 4 discloses a relative distribution of the DNL values of FIG. 3a;

FIG. 6 is a block diagram of one embodiment of the present invention;

FIGS. 7a–b are one example of the target of the switching order according to one embodiment of the present invention;

FIG. 11 discloses a relative distribution of the calibrated DNL values of FIG. 10a;

DETAILED DESCRIPTION OF THE INVENTION

Reference will now be made in detail to the embodiments of the present invention, examples of which are illustrated in the accompanying drawings.

Figures 6, 7A:
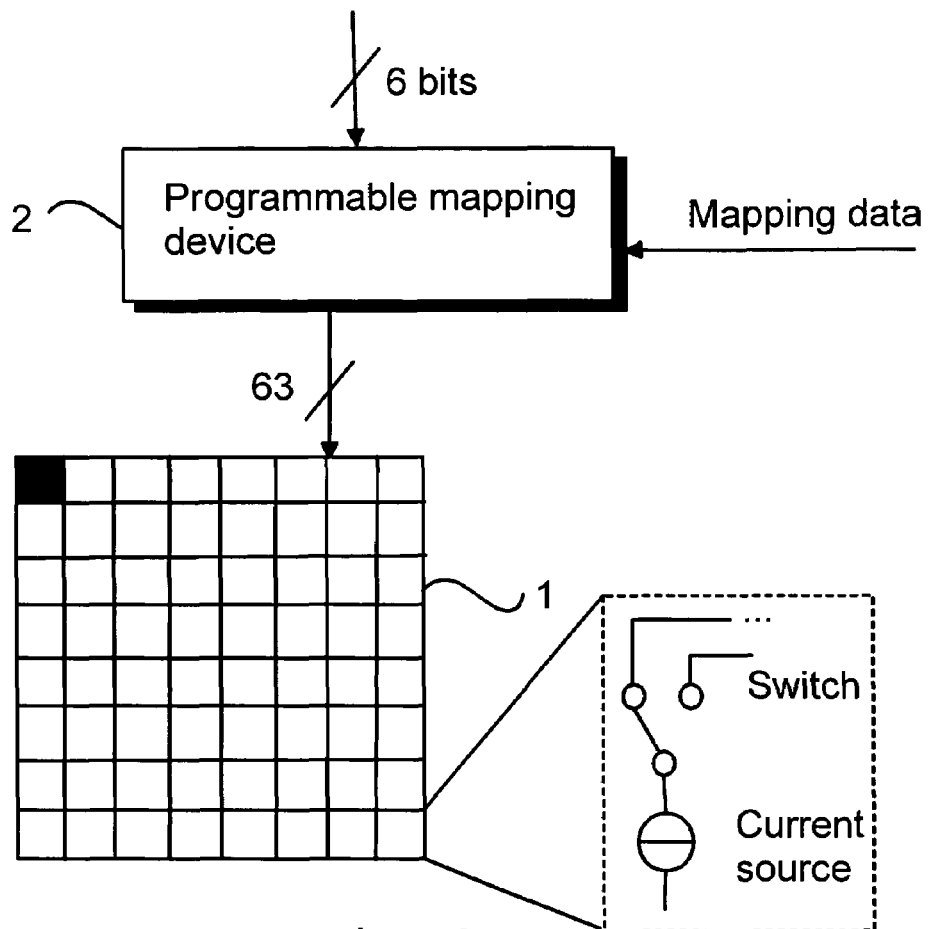

In this invention a new method for organising the switching order of the switchable current sources based on the analysed data of mismatch in said current sources is presented. In FIG. 6 is disclosed a block diagram disclosing a simplified principle example of the switchable current source array 1 that can be calibrated. Switchable current source means for example a combination of a current source and a switching element which together form a switchable current source. FIG. 6 also shows a programmable mapping device 2 which is used instead of the conventional thermometer decoder. The mapping device 2 is connected to the current switch array 1 in order to control the switching order of the current switches in the current switch array 1. In this example the mapping device can map any of the 6-bit input signals into any combination of the 63 output signals based on the result from the calibration algorithm of the present invention. In practise, a 63×63 cell RAM is capable of this function. The mapping data which is input into the mapping device 2 is based on the calibration algorithm and the data collected by it.

The calibration algorithm measures the current deviation of the current sources compared to the nominal value. Based on the measurements, the current sources are sorted in the optimal order to minimise the INL deviation. The details of the calibration algorithm are explained later in this application.

In order to get the optimised DC-linearity as well as the AC-linearity behaviour, the switching order of the first set of MSB current sources is selected so that the maximum positive and negative deviations from the nominal current are located in the beginning and in the end of the ramp. Every even code has a positive error and every odd code has a negative error. In the middle codes the deviation from the nominal value is at its minimum value. In the second set of MSB current sources every even code has a negative error and every odd code has a positive error.

FIGS. 7a–b demonstrate the target of the switching order mapping in the embodiment of the two switching arrays. Number 1 represents the smallest current $(I_0-I_{err,max,neg})$ and value 63 represents the maximum current $(I_0+I_{err,max,pos})$.

Figures 3A, 3B:
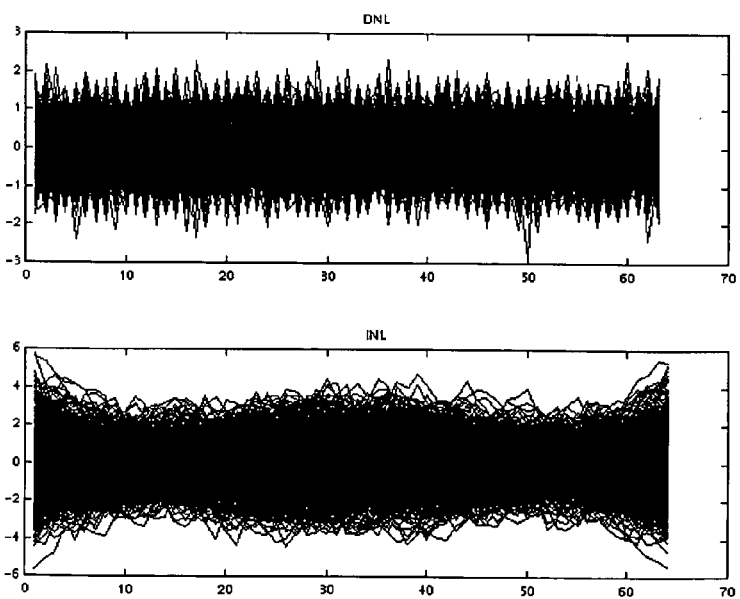
FIGS. 3a–b disclose the DNL and INL curves of the prior art unweighted MSB array, respectively.
Figure 4:
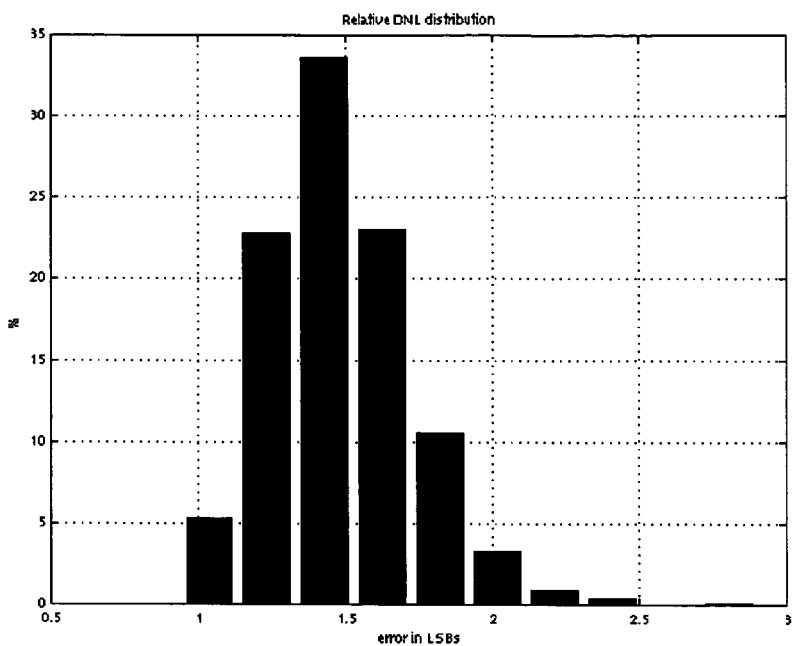
Figure 5:
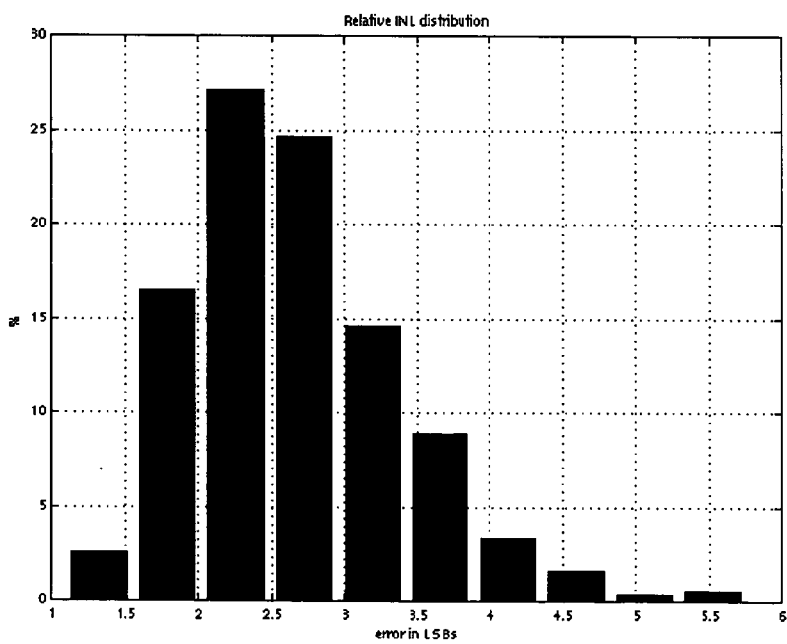
FIG. 5 discloses a relative distribution of the INL values of FIG. 3b.
Figures 8A, 8B:
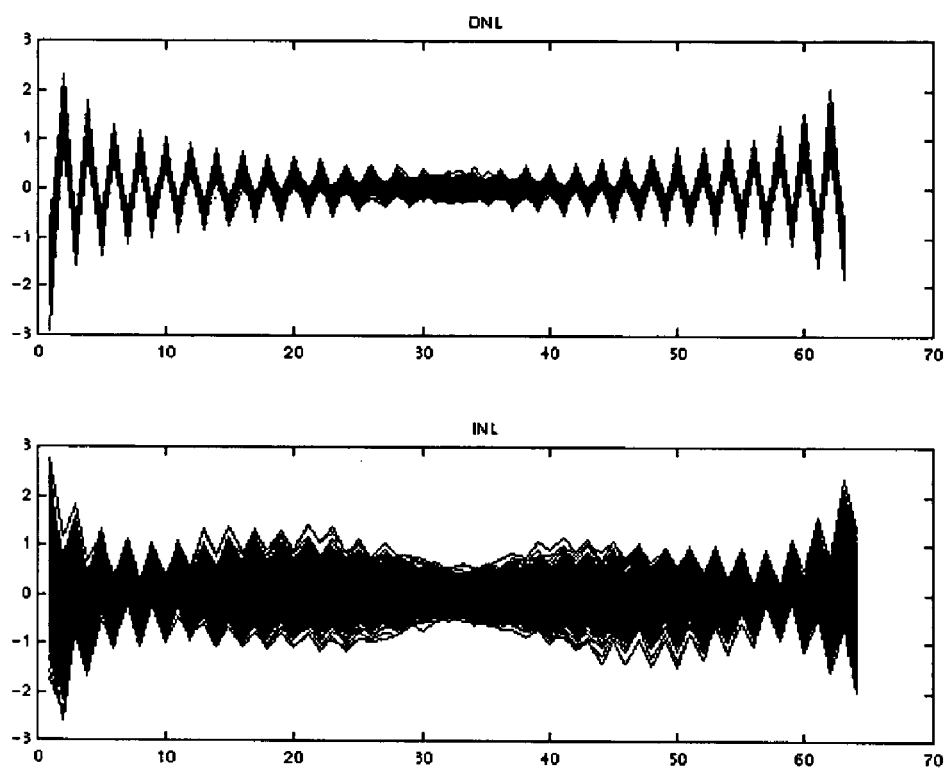
FIGS. 8a–b disclose the DNL and INL curves, respectively, after the calibration according to one embodiment of the present invention.
Figure 9:
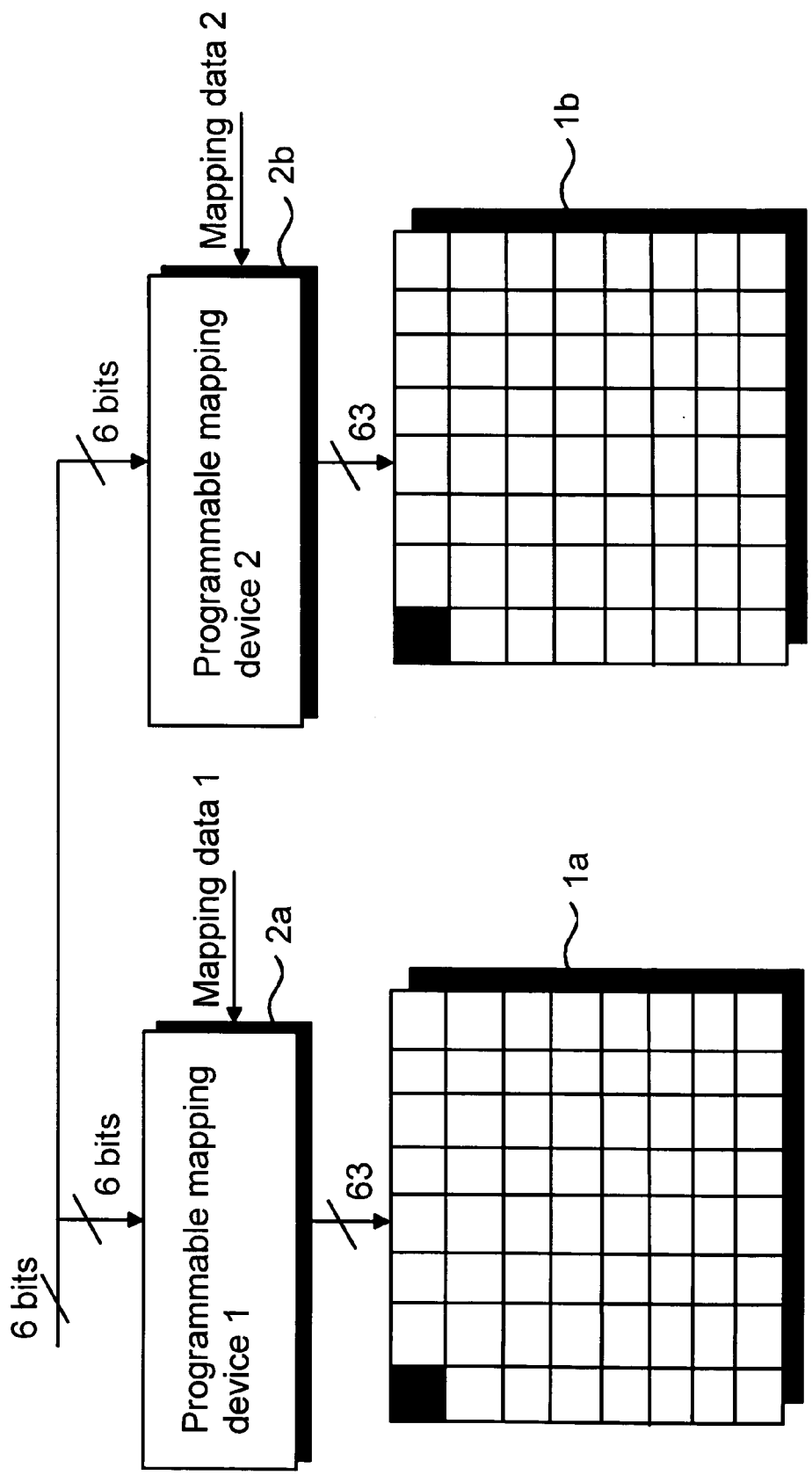
FIG. 9 is a block diagram of another embodiment of the present invention.

The calibrated linearity curves of the structure in FIG. 6 are shown in FIGS. 8a and 8b, respectively. The curves are calculated with the same current source data as the non-calibrated curves in FIGS. 3a and 3b. A 4-bit quantization is used for the deviation measurement. This basically means that a 4-bit ADC (analog-to-digital converter) could be used for the error measurement. For each run the maximum code deviation is scaled to the maximum error.

Figures 10A, 10B:
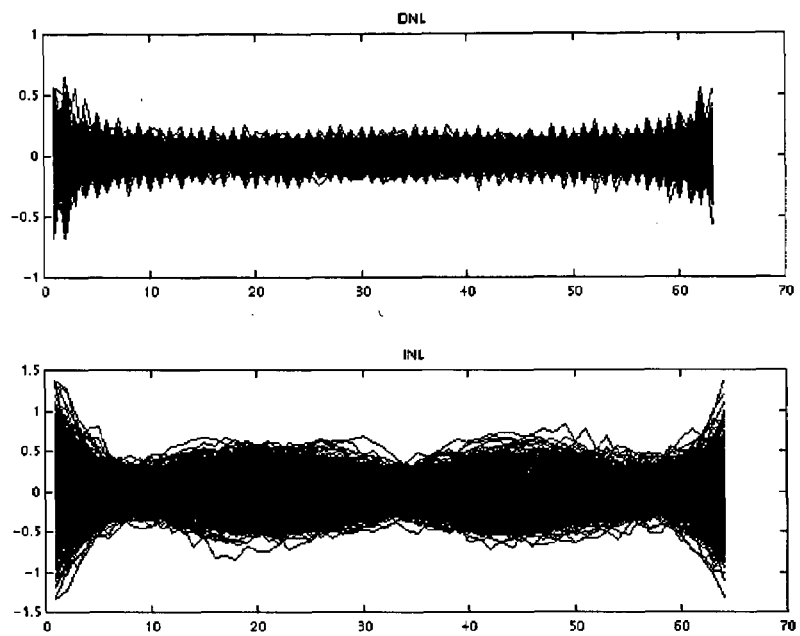
FIGS. 10a–b disclose the DNL and INL curves, respectively, after the calibration according to the embodiment of FIG. 10.

A block diagram of an improved implementation of the calibration is disclosed in FIG. 10. In this embodiment, two parallel switching arrays 1a, 1b are used that both have their own programmable mapping devices or mappers 2a and 2b. It is to be noted that a switching array means here an array whose elements consist in a current source and a switch connected to said current source. The current of the arrays are connected together at the top level, so that the unit current is twice the unit current in one array. Both arrays 1a and 1b have their own mapping devices 2a and 2b, which are connected to the same digital input signal.

The above-mentioned and presented mapping is used in the array 1a. In the array 1b, a reverse orientation of the negative and positive errors or deviations is used. This is controlled with mapping data 1 and 2, respectively. When the output currents are summed at the top level, each of the positive errors in array 2a is used in parallel with negative errors in array 2b and vice versa. Now the current deviations are always compensated by the complementary deviation from the other array.

Figure 12:
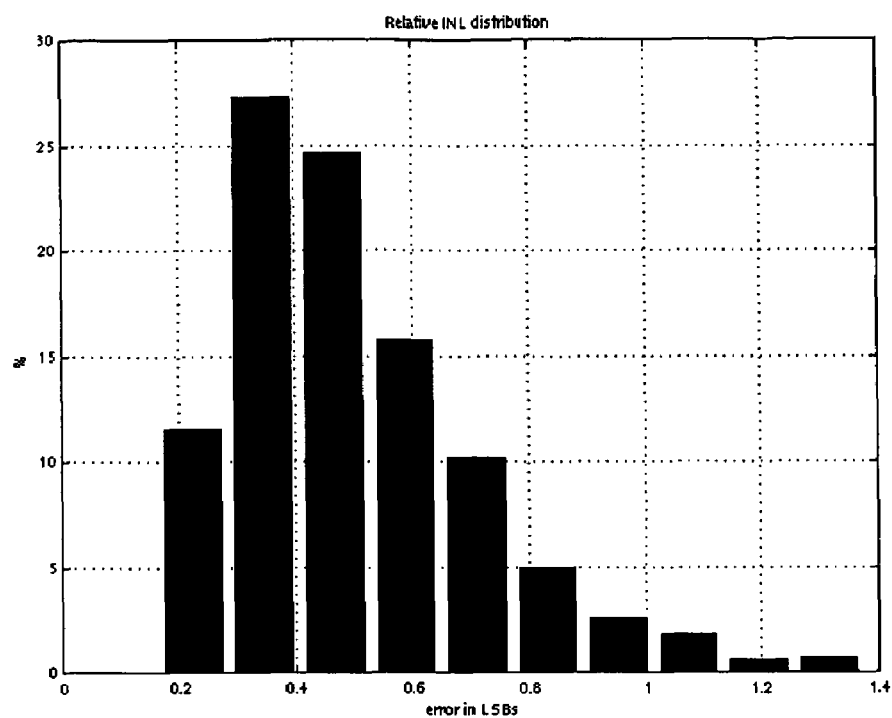
FIG. 12 discloses a relative distribution of the calibrated INL values of FIG. 10b.
Figure 1:
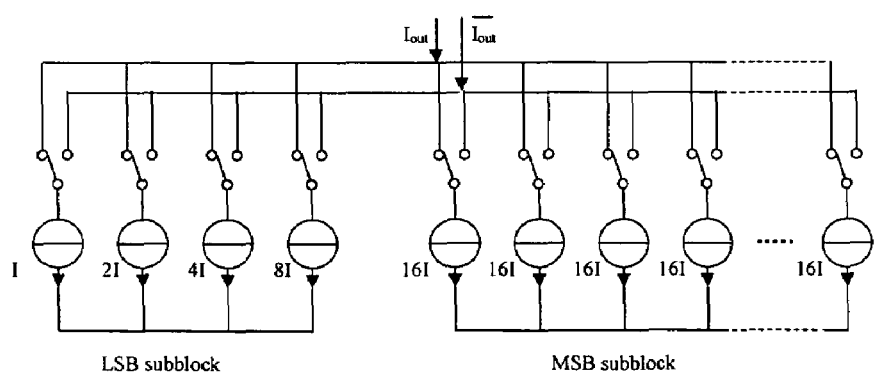
FIG. 1 discloses a prior art segmented current steering D/A-converter.
Figure 2:
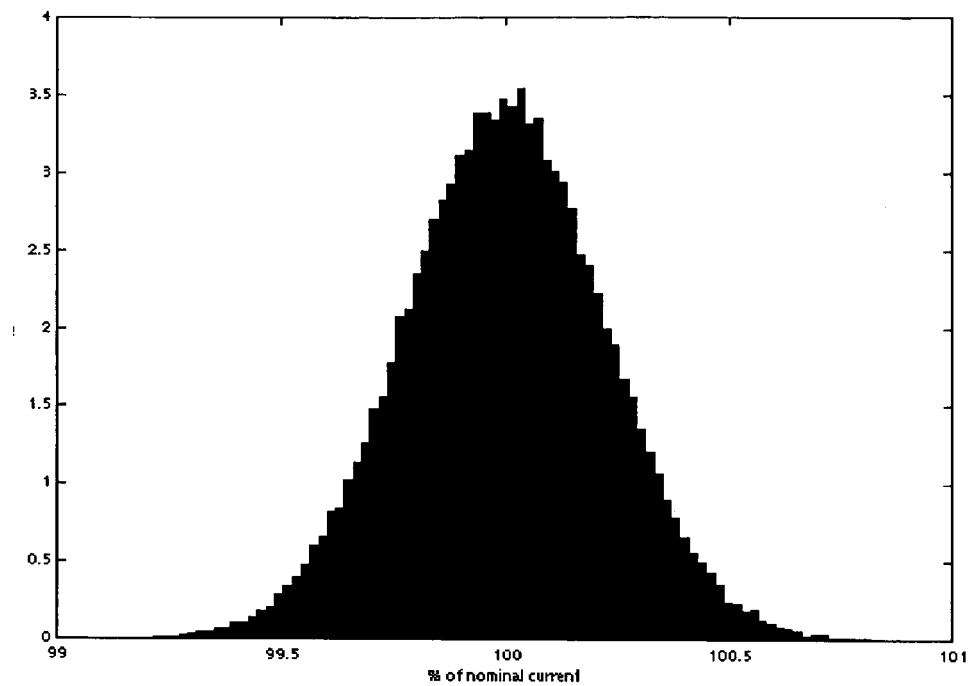
FIG. 2 discloses a distribution of the currents in a typical set of the current sources.
Figure 11:
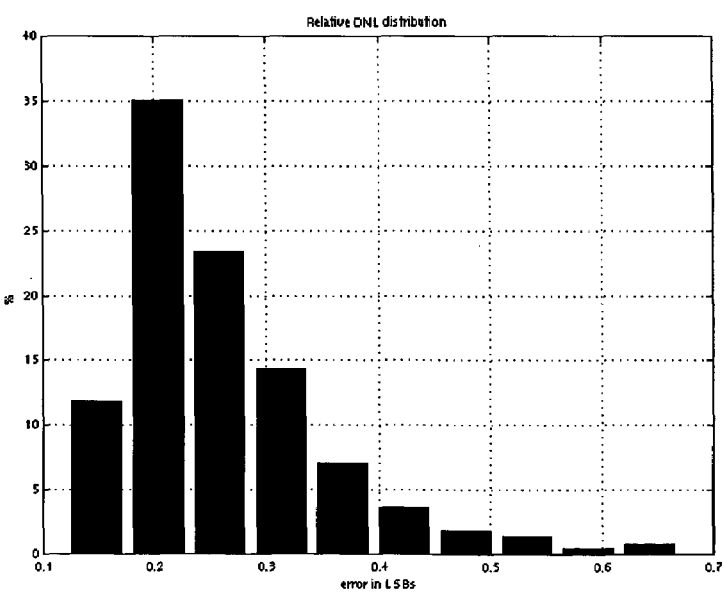
Figure 13:
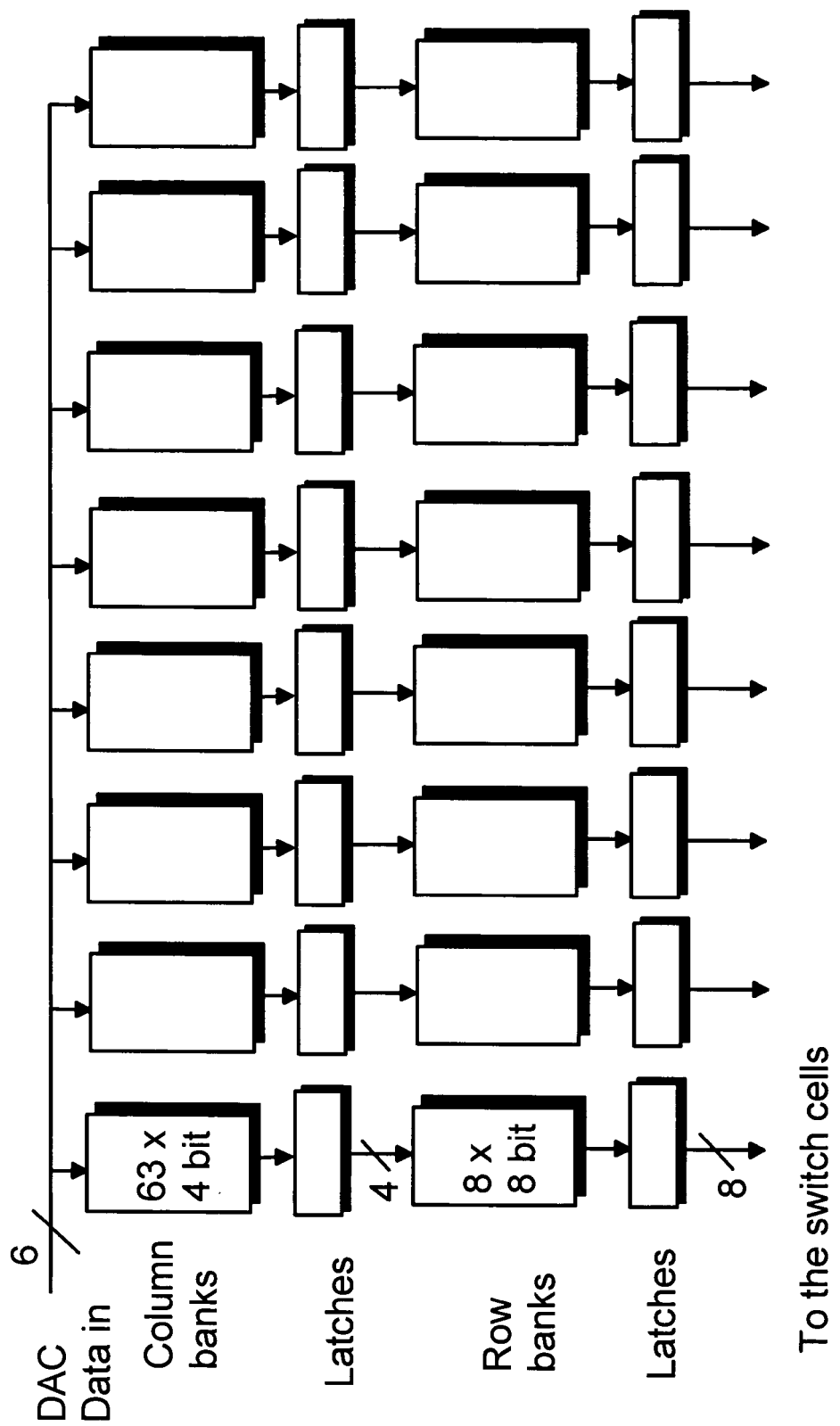
FIG. 13 is a block diagram of mapper in the present invention.

In FIGS. 11a and 11b the improved calibrated linearity curves are shown. The 4-bit quantization is used for the deviation measurement. The relative distributions of the DNL and the INL are shown in FIG. 12 and FIG. 13.

Figure 14:
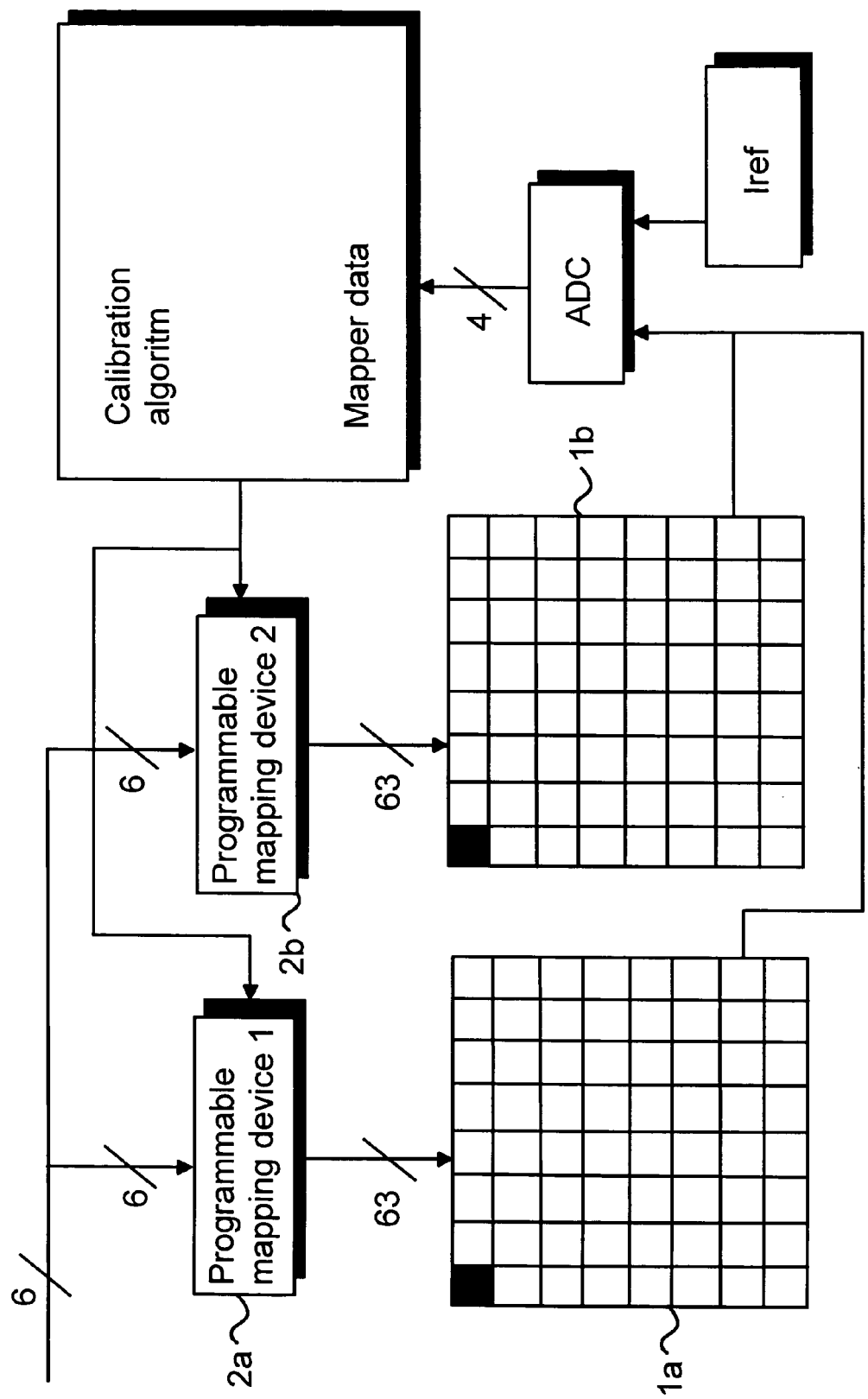
FIG. 14 is a block diagram of the calibration system according to one embodiment of the present invention.

A mapping device which is capable of the required mapping function is a simple RAM (Random Access Memory, RAM) circuit. However for a 63×63 bit RAM 3969 cells are needed. If the target of the DAC is to operate at the several hundreds of megahertz sampling rate, the 63×63 bit RAM is not optimal. There is a possibility to reduce the number of cells. To improve the performance, the RAM can be divided into column and row units, as shown in FIG. 14. If this kind of row/column configuration is in use, the addresses of the mapping device RAM in the calibration algorithm should also be row column addressed.

The column banks are 63×4 bit RAM circuits that get the 6 MSB's of the input data and map their output to the row banks. For each of the 6-bit input code there is an address value for the row RAM that tells how many switches there are to be switched from the selected column. The zero value express that no cells are switched from the column.

The 8×8 bit RAM row banks map the switching order of the elements or cells in each of the columns. For each 8 address code from the column bank, there is a unique 8-bit word that switches one more switch cells compared to the previous word. The address codes above 8 are discarded.

The latches between both the column banks and row banks and between the row banks and the array of the current switches are for synchronisation purposes to quarantee the high-speed operation.

Figure 15:
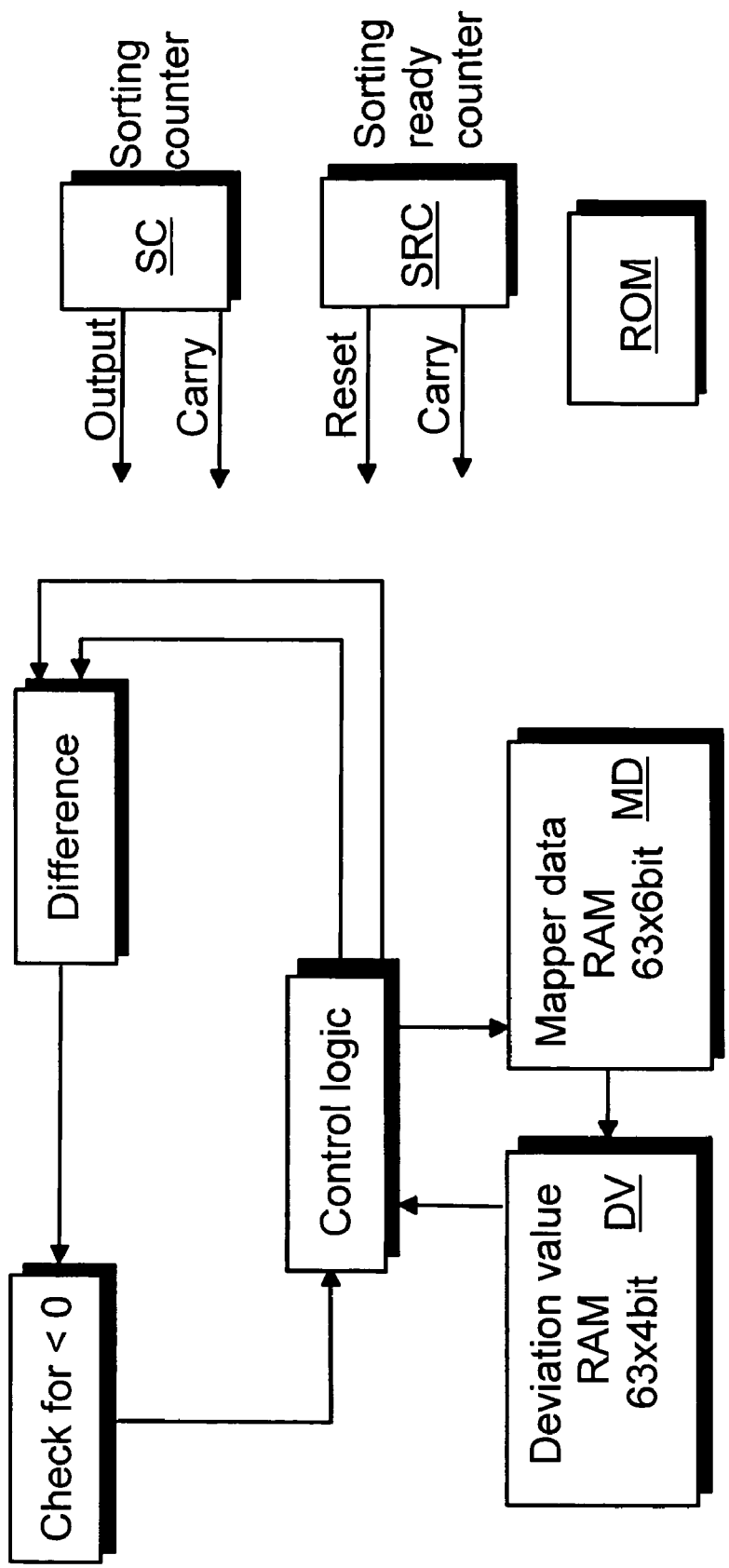
FIG. 15 is a block diagram representing the calibration hardware implementation according to one embodiment of the present invention.

The basic block diagram of the implementation of one embodiment of the present invention is shown in FIG. 15. The block diagram shows the case with two switch arrays 1a and 1b. The calibration algorithm itself can be fully implemented with software.

The $I_{ref}$ is a reference current source which is used for current comparison of the current sources in the arrays 1a and 1b. In this example, the reference current is mirrored from the same bias that is used for biasing the current sources of the DAC. The reference current can be designed for high precision performance by using averaging and common centroid layout, because there is no need for high speed operation for the ADC.

The ADC is a low speed, low resolution ADC that is used for analysing the deviation of the current source current from the reference current. A 4-bit resolution is used in the calculations shown in the examples above. The ADC measuring range can be tuneable, so that the measurement range can be fixed to get the necessary range by measuring all sources and checking if the codes on the edges are not used.

The calibration algorithm gets the deviation values of the current sources one by one and using these values sorts the switching order properly. The mapping data is loaded to the mapping device and the DAC is ready for normal operation.

Figure 16A:
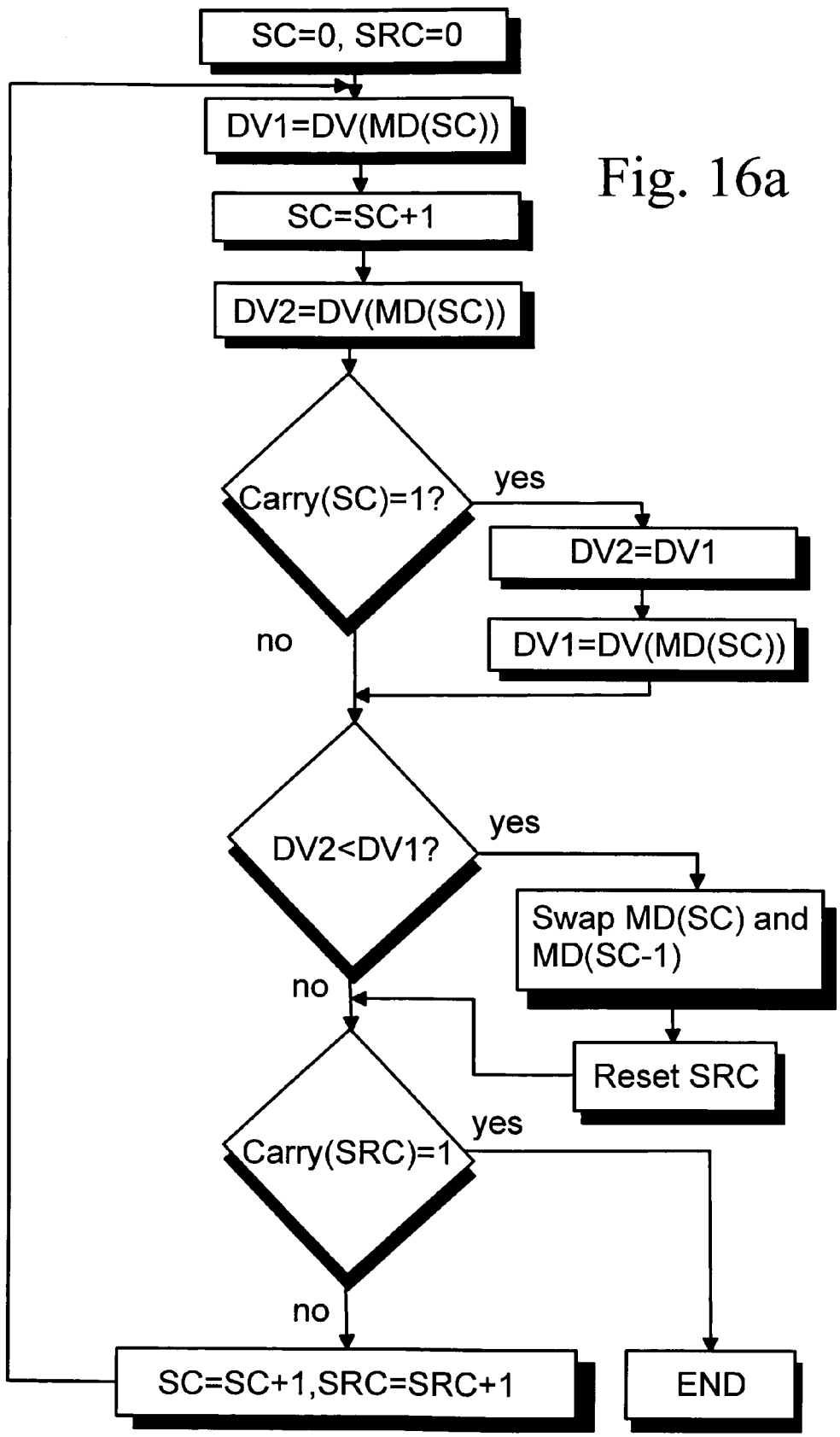
FIGS. 16a–b are flowcharts describing the first phase of the sorting algorithm according to one embodiment of the present invention.
Figure 16B:
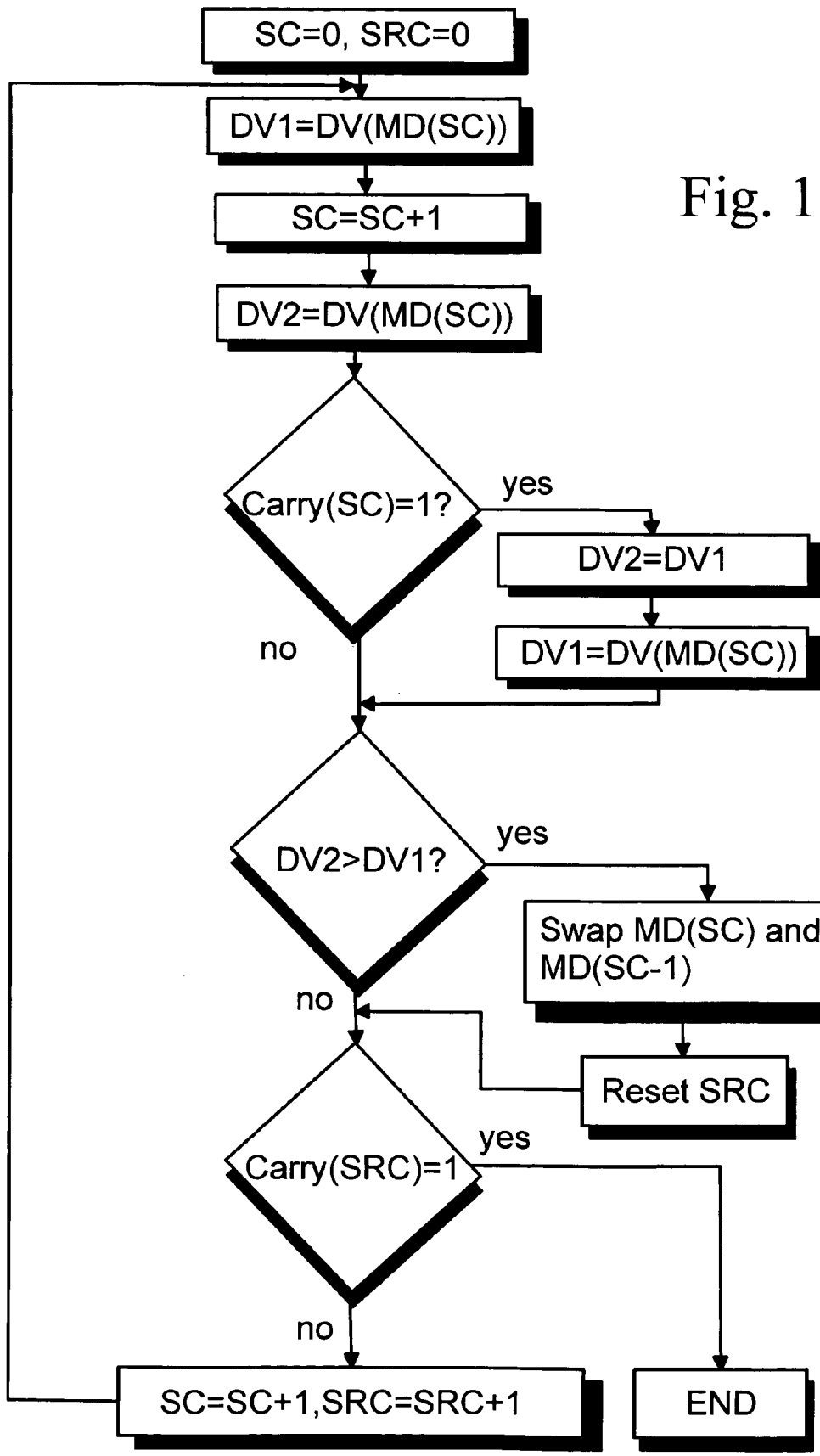
Figure 17:
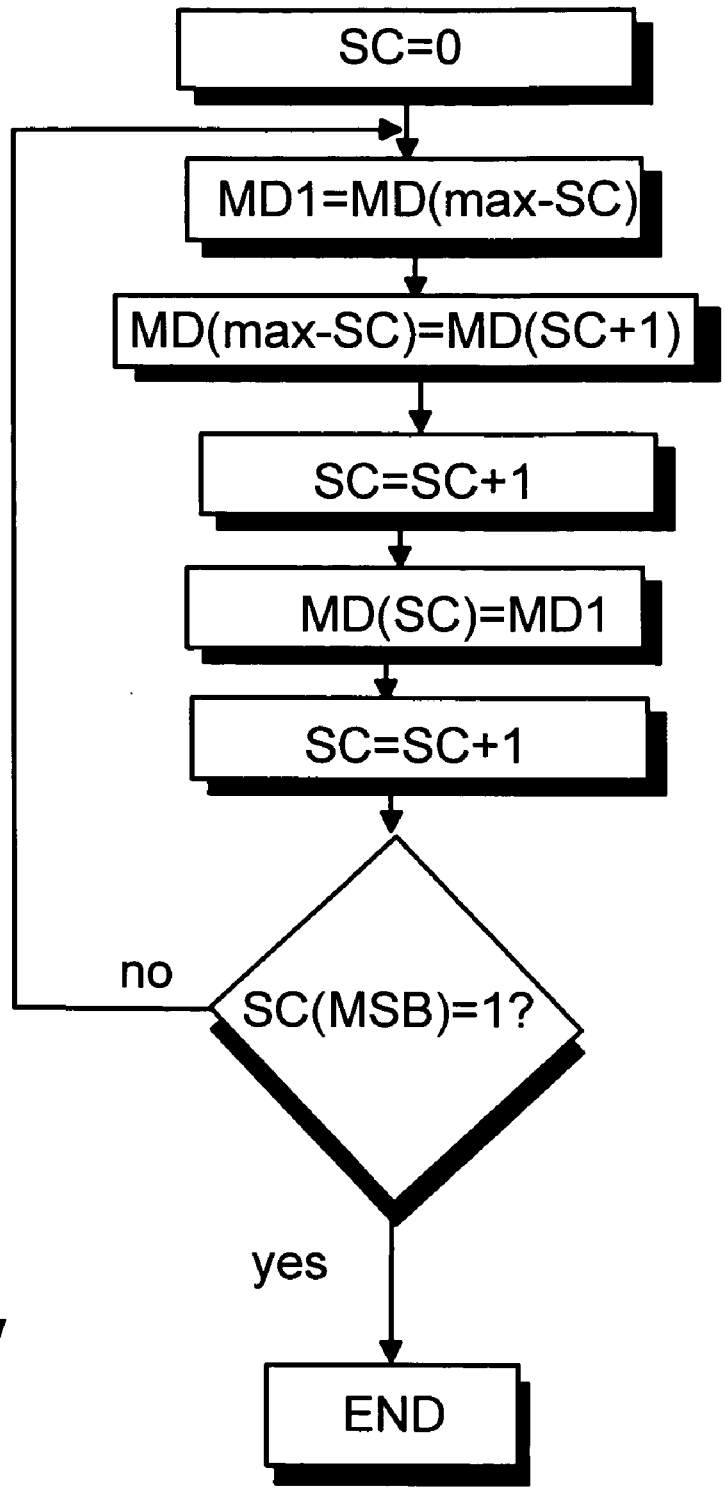
FIG. 17 is a flowchart describing the second phase of the sorting algorithm according to one embodiment of the present invention.

The details of the calibration algorithm are explained in the following paragraphs with reference to FIGS. 16–18. The hardware implementation of the algorithm is shown in FIG. 16. This also explains the required blocks mentioned in the software implementation. The resolution of the ADC determines the accuracy of the calibration method, and the resolution can be 2–6 bits. In these examples, a 4-bit resolution is used. If a higher resolution is used, the deviation value RAM increases also, since the word length determines the number of cells. The control logic controls the progress of the calibration.

The calibration algorithm has four different phases. In the first phase the deviation data is collected with the ADC and stored in the deviation value RAM. The next two phases make the actual sorting. First, the data is sorted in increasing or decreasing order, and then the mapping device values are randomised, as shown in FIG. 7. In the last phase, the correctly sorted mapping data is loaded to the mapping device.

In the first phase, an initialise data is loaded to the mapping device from a ROM. This mapping data maps current sources from the array one by one so that all of the 63 current sources in each array can be separately measured. All of the currents are compared with the reference current, and the difference is converted with an ADC. In this example, a 4-bit ADC is used. Now for each of the current source there is a 4-bit number in the deviation value RAM that represents the deviation from the reference current.

In the second phase the deviation values are used to generate a mapping data, where the errors are in increasing or in decreasing order. The sorting counter SC is a 6-bit counter with its maximum value of 2^6−1=62 and a carry bit. In the next state after the maximum value (62) the output overflows giving the value of 0 to the output and flags the carry bit. The sorting counter SC gives the address values for the Mapper Data MD, from where the addresses for the Deviation Value DV RAM are loaded. The Sorting Ready Counter SRC is a 6-bit counter that controls the progress of the sorting. When the SRC overflows and the carry bit is active, the first phase of the sorting is ready.

The flowchart of the first phase of the calibration algorithm is shown in FIGS. 17a–b in the case of the two switching arrays. The expression DV(MD(SC)) gives the value in the deviation value RAM DV pointed by the address value in the mapping data RAM MD. The address value from the mapping data RAM MD is sorting counter SC. DV1 and DV2 are the numbers from the deviation value RAM DV to be compared.

A special case is when the SC counter overflows after reading the deviation value for DV1. In that case the DV2 is loaded from the first address location. The last and the first value must be compared in reversed order. The carry signal of the SC counter is used for indicating the situation."

The sorting ready counter SRC is reset every time a mapping data swap is carried out. If the counter is not reset for 64 steps, the counter overflows and the carry bit becomes active. At that point all deviation values are compared without swapping, and they are in increasing order. An important note here is that since the number of cells is odd, for every round different values are compared (1<=>2, 3<=>4, . . . 61<=>62, 63<=>1, 2<=>3, . . . 62<=63, 1<=>2, . . . ).

In the two-array system shown in FIG. 10 for the second array the comparison of the values DV1 and DV2 is done in reversed order. After the first sorting, the values are in decreasing order, so that the first cell is the largest positive error and the last cell is the largest negative error. The same hardware implementation can be used. After the first phase of the sorting, the deviation values can be discarded.

The second phase of the calibration algorithm simply organises the mapping data into the final order. The second phase of the calibration algorithm takes numbers from the second half of the mapper data RAM and moves them to the first half of the mapper data RAM, so that the first memory location stays unchanged, the second is swapped with the last value. The third is unchanged, the fourth is swapped with the third from the end, etc. The flowchart of the algorithm is shown in FIG. 18. The term 'max' indicates the maximum value, 62 in this example, of SC counter. The flowchart is valid for both of the arrays if the two array structure is in use. In the final phase, the sorted mapping device is loaded to the mapping device. In the two array topology, all four phases are repeated with the second array.

It is obvious to a person skilled in the art that with the advancement of technology, the basic idea of the invention may be implemented in various ways and in various network environments The invention and its embodiments are thus not limited to the examples described above, instead they may vary within the scope of the claims.

The invention claimed is:

1. A digital-to-analog converter (DAC) comprising:
   a set of switchable current sources which are operable in a controlled order; and
   a mapping device that is connected to said set of switchable current sources to control the operating order of said current sources, wherein said set of switchable current sources is divided into two arrays of switchable current sources and said mapping device is divided into two independent mappers that are connected to said arrays of switchable current sources;

a calibration device that is connected to said mapping device; and a measuring device that is connected to said two arrays of switchable current sources for measuring a current deviation of the sources in said arrays.

2. The digital-to-analog converter according to claim 1, wherein said digital-to-analog converter further comprises a reference current source that is connected to said measuring device.

3. The digital-to-analog converter according to claim 1, wherein said calibration device comprises:

a sorting device for sorting current deviation values from said measuring device;

storing device for storing said deviation values and/or mapping data; and control logic for controlling said sorting device.

4. The digital-to-analog converter according to claim 3, wherein said sorting device comprises:

a sorting counter; and a sorting ready counter.

5. The digital-to-analog converter according to claim 3, wherein said sorting device comprises a read-only storage for storing mapping data for initialization of said calibration device.

6. The digital-to-analog converter according to claim 1, wherein said measuring device is an analog-to-digital converter.

7. A calibration method for calibrating a digital-to-analog converter which uses a set of switchable current sources, in which method said switchable current sources are arranged to operate in a pre-determined order, comprising:

collecting the current deviation data in pro-portion to a reference current from said set of switchable current sources;

sorting said switchable current sources to the switching order in which the positive and negative deviations of the switchable current sources from said reference current compensate each other; and loading said switching order to said mapping device as a mapping data to switch the switchable cur-rent sources in the calibrated order.

8. The method according to claim 7, further comprising at said sorting step:

selecting the switching order so that the largest positive deviation from the reference current is the first, the largest negative deviation from the reference current is the second, the third largest positive deviation from the reference current is the third, the third largest negative deviation from the reference current is the fourth, and so on, wherein the second latest is the second largest negative deviation, and last one is the second largest positive value.

9. The method according to claim 7, wherein initializing the calibration by loading to said mapping device a piece of mapping data that switches said switchable current sources one by one to compare them independently to the reference current.

10. The method according to claim 7, wherein in case of two independent arrays of switchable current sources, sorting a first piece of mapping data for the first array in the first order and a second piece of mapping data to the reverse order compared to the first order.

11. The method according to claim 7, further comprising at said collecting step:

measuring the current values of said current sources by an analog-to-digital converter to produce a digital value for said deviation.

* * * * *